United States Patent [19]

Gindi

[11] Patent Number: 4,547,890
[45] Date of Patent: Oct. 15, 1985

[54] APPARATUS AND METHOD FOR FORMING D.C. FREE CODES

[75] Inventor: Abraham M. Gindi, 1778 Curtner Ave., San Jose, Calif. 95124

[73] Assignee: Abraham M. Gindi, San Jose, Calif.

[21] Appl. No.: 424,938

[22] Filed: Sep. 28, 1982

[51] Int. Cl.[4] .......................................... H03K 13/02
[52] U.S. Cl. .............................. 375/19; 340/347 DD; 360/45
[58] Field of Search ............ 375/18, 19; 340/347 DD; 360/41, 45, 51; 371/55, 57

[56] References Cited

U.S. PATENT DOCUMENTS

| | | | |
|---|---|---|---|
| 3,108,261 | 10/1963 | Miller | 340/347 DD |
| 3,753,113 | 8/1973 | Marvta et al. | 375/19 |
| 3,783,383 | 1/1974 | Forster et al. | 375/19 |
| 3,810,111 | 5/1974 | Patel | 340/347 DD |
| 3,905,029 | 9/1975 | McIntosh | 360/41 |
| 3,906,485 | 9/1975 | Hong et al. | 375/19 |
| 3,995,264 | 11/1976 | Ouchi | 340/347 DD |
| 4,027,335 | 5/1977 | Miller | 360/40 |
| 4,234,897 | 11/1980 | Miller | 360/40 |

OTHER PUBLICATIONS

Lodewijk et al., "The Compact Disc Digital Audio System" the 67th Convention 1980, Oct. 31/Nov. 3, N.Y. Audio Eng. Society Reprint.
Dol "General Information on a Compact Digital Audio Disk" Audio Eng. Society vol. 29, No. ½ 1981, Jan.-/Feb. pp. 9–12.
A. M. Patel, "Zero-Modulation Encoding in Magnetic Recording", Jul. 4, 1975, IBM J. Res. Develop., vol. 19, No. 4, pp. 366–378.
S. J. Hong et al., "Codes for Self-Clocking, AC-coupled Transmission Aspects of Synthesis and Analysis", Jul. 4, 1975, IBM J. Res. Develop., vol. 19, No. 4, pp. 358–365.
C. E. Shannon, "A Mathematical Theory of Communication", Jul. 1948, The Bell System Technical Journal, vol. XXVII, No. 3, pp. 379–423.
A. M. Patel, "Charge-Constrained Byte-Oriented (d,k) Code", IBM Technical Disclosure Bulletin, vol. 19, No. 7, (Dec. 1976).

*Primary Examiner*—Robert L. Griffin
*Assistant Examiner*—Stephen Chin
*Attorney, Agent, or Firm*—Townsend & Townsend; Kenneth R. Allen

[57] ABSTRACT

A method and apparatus for the elimination of any net d.c. component from the transmission of binary sequential data in a run length limited code where the encoding set has less than the number of code values required to provide one-to-one mapping from source data to an encoded set satisfying preselected constraints. The past and current parity and charge of the encoded words are employed as parameters in the method to determine encoding schemes satisfying criteria such as run length limit.

21 Claims, 5 Drawing Figures

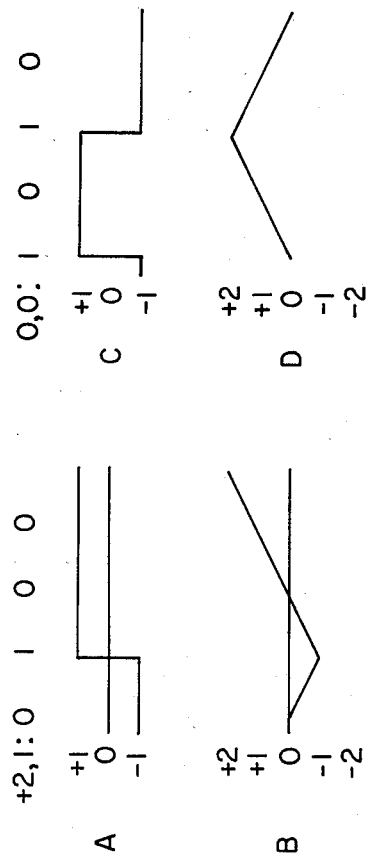
FIG._1.
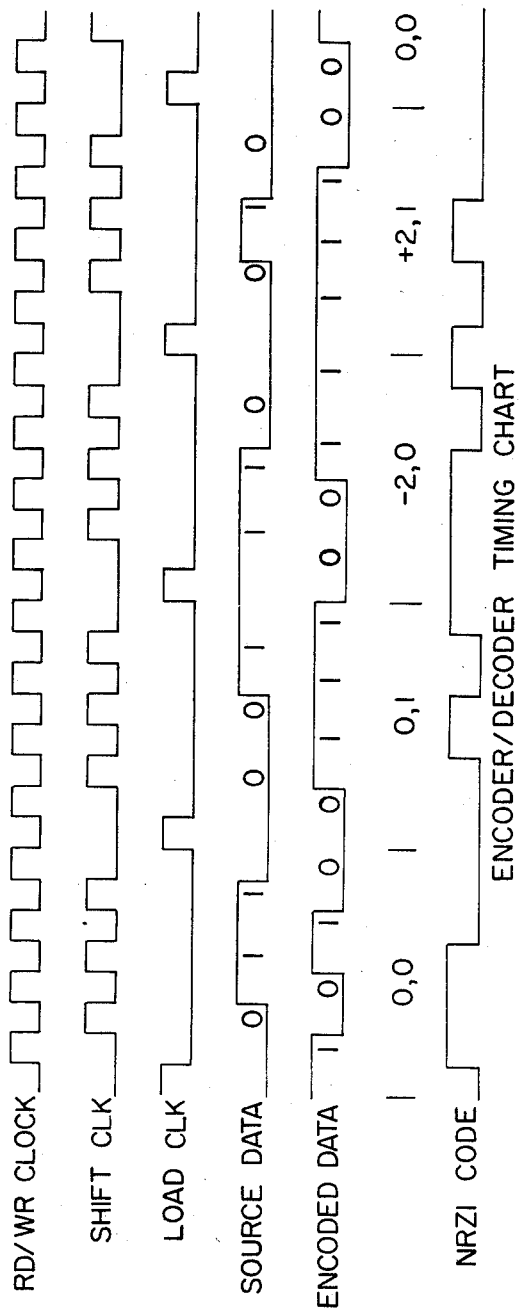
FIG._5.

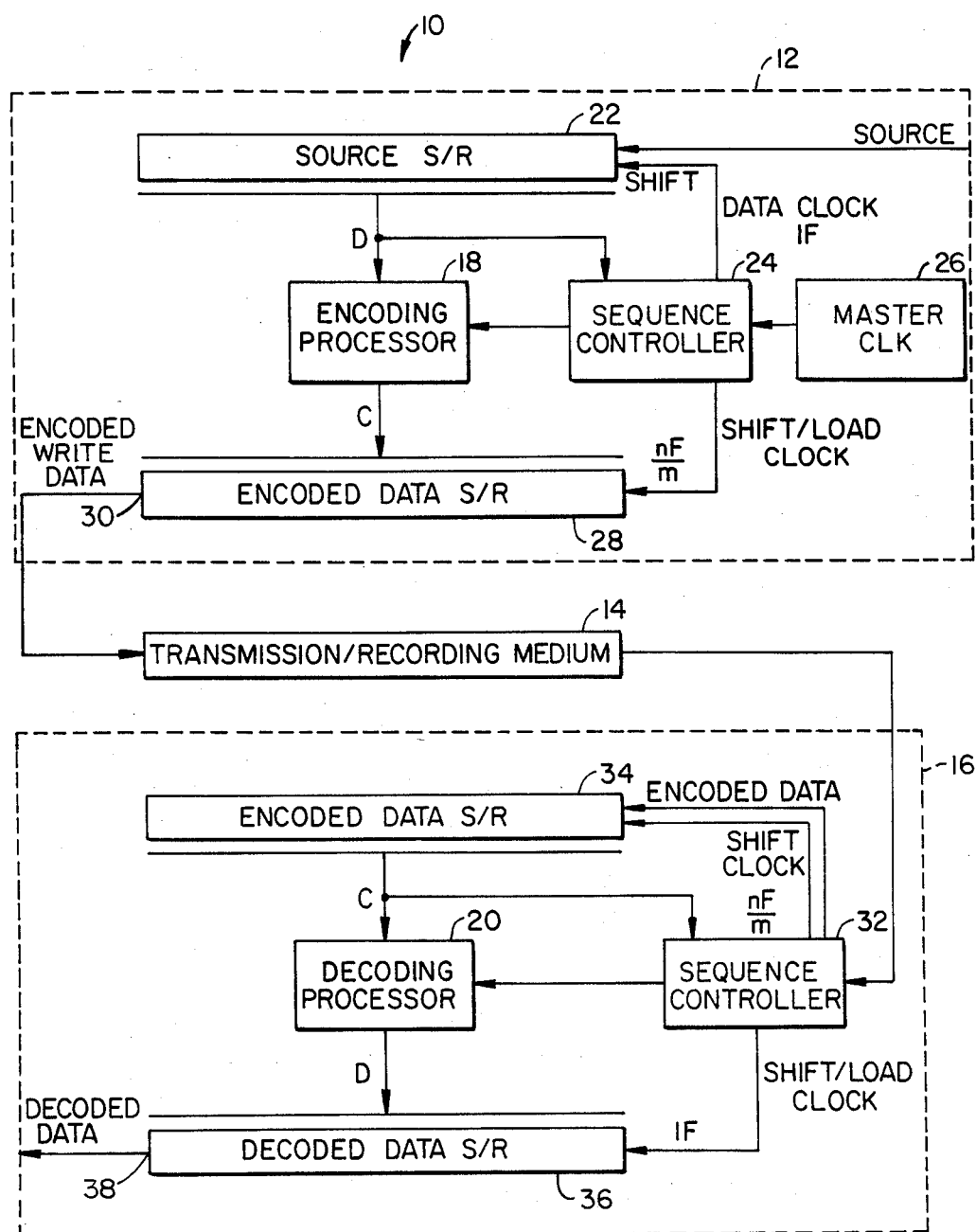
FIG._2.

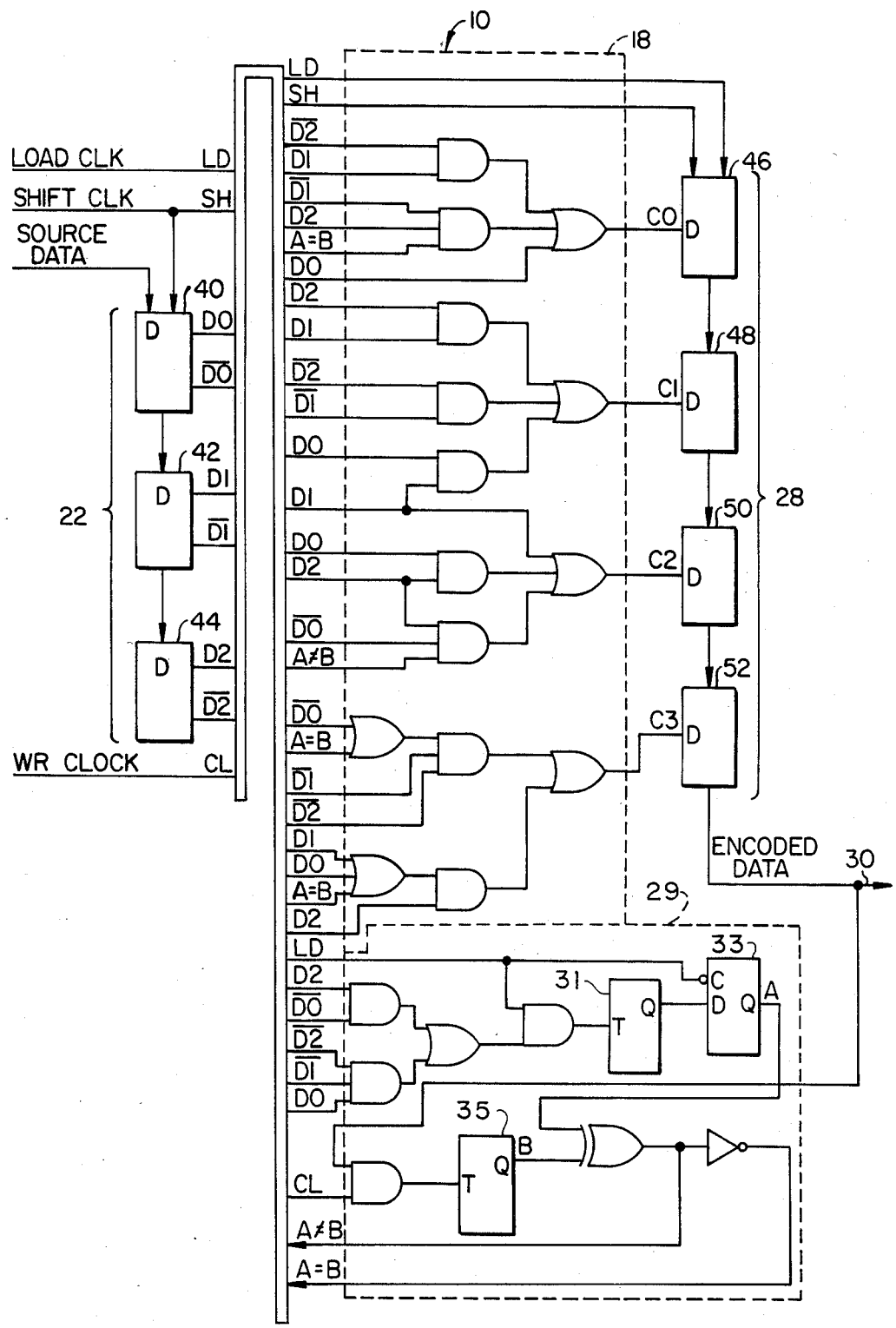
FIG._3.

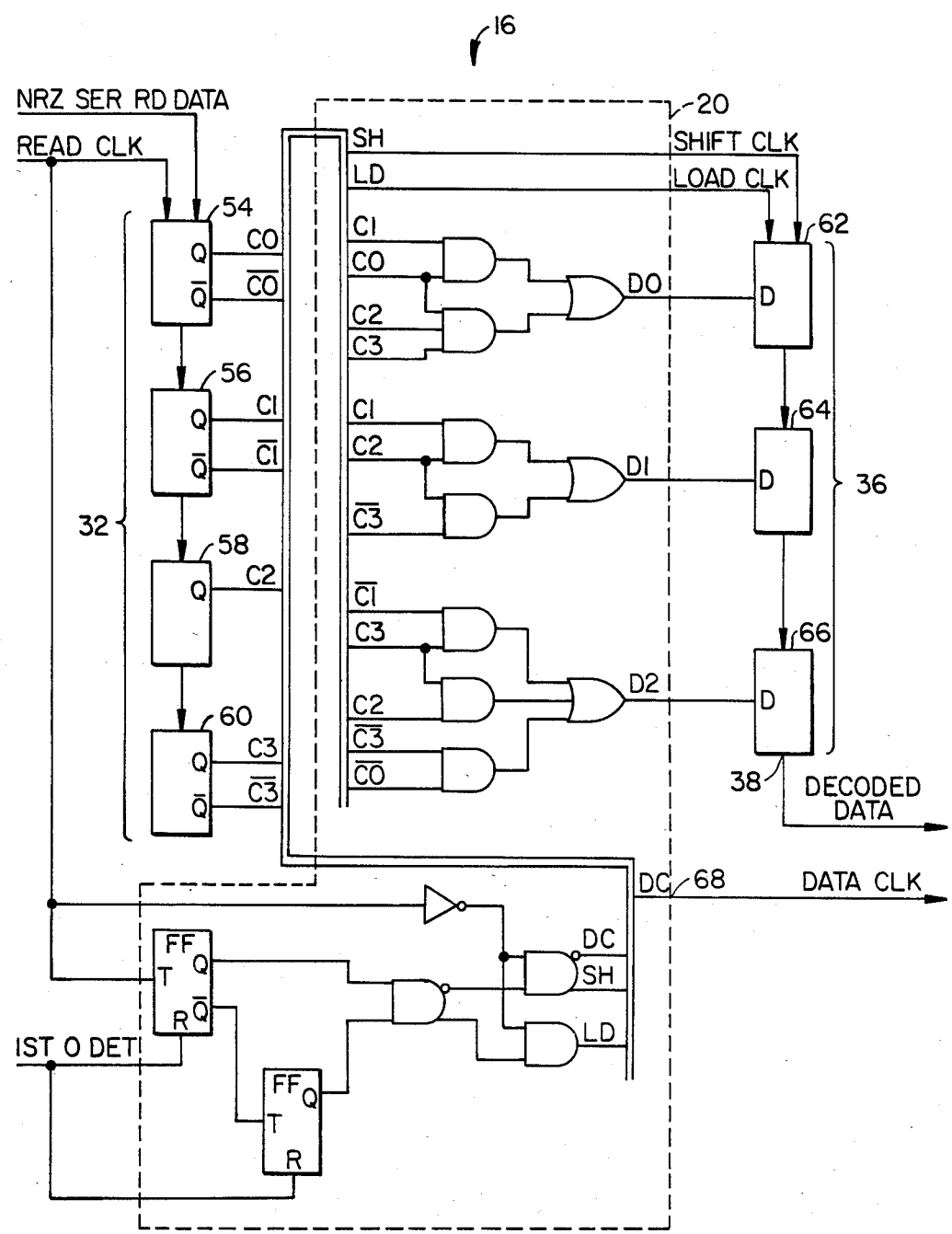
FIG._4.

APPARATUS AND METHOD FOR FORMING D.C. FREE CODES

BACKGROUND OF THE INVENTION

1. Field of Invention

This invention relates to the transmission of data in a constrained binary form serially through an information channel. More particularly this invention relates to a method and apparatus for efficiently transmitting signals sequentially which are free of d.c. bias in a run-length limited encoding scheme.

In the transmission of binary data, such as through a communication link or by recording on a magnetic medium, it is desirable to encode the data to achieve self synchronization and to prevent loss of any information based on the variation in the average or d.c. level of the signal conveying the encoded information. A common method of achieving self synchronization is to provide a minimum of transitions regardless of data content. At the same time, it is also desirable to maintain a controlled time separation between transition so as to avoid inter-symbol interference. A coding scheme in which the length of the symbol is limited is commonly referred to as a run-length limited code.

It is frequently desirable to include synchronization information in a transmission format or serialized data code. In magnetic recording, transitions at a particular time benchmark may be assigned the value 1, and the absence of a transition at a benchmark may be assigned the value 0. The typical detection process consists of detecting for the presence or absence of transitions at the time benchmarks.

In order to provide for the derivation of a properly synchronized clock to establish the benchmarks from the data in the desired transmission format, the transitions must occur frequently enough to provide synchronization pulses for the local clock device. Nevertheless, consecutive transitions must be sufficiently separated in time to limit inter-symbol interference to a level acceptable for reliable detection. Thus, source binary data must be encoded into a constrained encoded data having a coding format which limits the minimum and maximum time between consecutive sequences according to prescribed coding rules.

In many applications it is desirable to eliminate any d.c. signal component from the waveform which results from the transitions according to the data encoding scheme. A d.c. component in a signal waveform will result in a non-zero average value of amplitude and may cause charge accumulation in any a.c. coupling element in a data channel. Elimination of the d.c. component reduces errors in digital detection. In a waveform corresponding to a binary coded sequence, accumulated charge increases by one unit for a positive step and decreases by one unit for a negative step. The accumulated charge at any point in a binary coded sequence is generally defined as the difference between the number of positive and negative transitions.

Coded sequences may be denoted by parameters such as the shortest run length of zeroes between two consecutive transitions or ones, the longest run length of zeroes between any two transitions or ones and the accumulated charge at any digit position in the sequence.

A data encoding method may be viewed as a mapping or binary data into constrained binary sequences, the efficiency of which is the ratio of encoded binary data bits required to express source binary data bits.

What is needed is an encoding scheme for maximizing the efficiency of source binary data encoded into constrained binary sequences wherein the encoded binary sequences are free of d.c. component accumulation.

2. Description of the Prior Art

A common transmission format or data code is described in U.S. Pat. No. 3,108,261 to Miller issued Oct. 22, 1963. The Miller format described therein involves a suppression of any transition occurring at the beginning of one bit interval following an interval containing a transition at its center. The asymmetry of the waveform generated by the Miller constraints introduces undesirable d.c. components into the information channel.

A run-length-limited d.c. free code is described in Patel, U.S. Pat. No. 3,810,111 issued May 7, 1974 and by A. M. Patel in "Zero-modulation Encoding in Magnetic Recording", IBM J.Res. Develop., Volume 19, Number 4 July 1975 Page 366. Patel describes a one-for-one mapping of binary data into a constrained binary sequence which adapts the Miller code to a d.c. free code. Other descriptions of d.c. free run-length-limited codes are found in the following patents: Ouchi, U.S. Pat. No. 3,995,264 issued Nov. 30, 1976; Miller, U.S. Pat. No. 4,027,335 issued May 31, 1977; Miller, U.S. Pat. No. 4,234,897 issued Nov. 18, 1980.

Most of the prior art d.c. free run-length-limited encoding techniques have concentrated on the so-called double frequency codes wherein the code rate is about 0.5, i.e., two code bits represent each data bit, and most prior art schemes employ a complex state sequence algorithm to structure d.c. free codes which contain the necessary run-length-limited constraints. The prior art codes usually start with reference to the shortest word based on the code rate. Consequently, the coding schemes have a limited vocabulary and make up for the limited vocabulary by attempts to achieve other desirable characteristics by increasing the complexity of the encoding algorithm, including a complex look-ahead capability.

In certain applications, particularly in magnetic recording media in which the magnetic coating must be fully saturated, it is desirable to encode data with density ratios of not less than 1.0, that is, an encoding scheme which allows no more than one flux transition per data bit. Under conditions in which flux reversal is not a critical criterion, such as cable transmission or recording on non-saturable media, density ratios less than 1.0 can be tolerated in exchange for a wider detection window. The density ratio is but one constraint imposed upon encoded binary sequences. While this constraint is inherent in the description of many codes, including the examples used herein, this constraint is not necessarily a restriction on the encoding scheme described hereinafter.

SUMMARY OF THE INVENTION

According to the invention, run-length-limited codes, with fixed or variable word lengths, are structured according to this invention to meet d.c. free constraints. A d.c. free code according to the invention is constructed by the use of combinations of words that are balanced, of words that balance each other, or of non-balancing combinations of words which are combined together to limit the accumulated charge and eventually attain a balancing combination. The invention structures codes based primarily on the past and current parity and charge of the encoded words from which the encoding set is constructed. This invention is particularly applicable where there is no one-to-one mapping of source data into an encoded data set.

According to the coding scheme used herein there is no need for a complex look ahead capability as in prior art codes. Moreover, look back requirements are restricted to maintaining statistics of the previously encoded patterns in terms of bit parity and accumulated charge value.

BRIEF DESCRIPTION OF THE DRAWINGS

FIG. 1 is a timing diagram for two encoded binary values for illustrating accumulated charge and polarity characteristics.

FIG. 2 is a block diagram of an encoding and decoding system according to the invention.

FIG. 3 is a logic circuit diagram of a specific embodiment of an encoder according to the invention.

FIG. 4 is a logic circuit diagram of a specific decoder according to the invention.

FIG. 5 is a timing diagram depicting operation of the circuits of FIGS. 3 and 4.

DESCRIPTION OF SPECIFIC EMBODIMENTS

The invention may be expressed in terms of an encoding algorithm which is used to convert a sequence of six bit words into a binary sequence having the desired constraints. While the invention may be used with variable length words, for simplicity, the invention is explained with reference to fixed length words used in varying combinations.

In order to further the understanding of the encoding schemes, it is helpful to review the various constraints imposed upon codes and the significant characteristics of d.c. free codes.

The following constraints, designated d, k; m, n; r and c, are as follows: where d = Minimum number of zeroes between one bits
k = Maximum number of zeroes between one bits
m = Minimum number of bits of binary data, or minimum word length (word) to be encoded
n = Number of code bits for each m data bits
r = Number of different word lengths in a variable word length code
c = Maximum amplitude of instantaneous charge allowed by the code, usually given in terms of coded bit cell times as ±c When considering d.c. free codes, there are three characteristics of each word that must be taken into account:

1. The polarity of the remanent d.c. charge assuming the word is begun with a negative level.
2. The amplitude of the remanent d.c. charge given in terms of encoded bit cell times.
3. The modulo 2 sum (parity) of the transitions in the word.

When calculating the polarity and charge of a word, it is assumed that each transition occurs at the leading edge of each one-bit cell. Thus the word 0100 contains a net remanent charge of +2 and has an odd number of bits. It is therefore designated as +2,1. The word 1010 contains zero remanent charge, and is designated a 0,0 word.

Although common usage assumes transitions occur with every one bit, the code is not restricted to one bits transitions, since it is entirely possible to structure codes that have transitions with every zero bit which conform to the invention. It is the transitions which are significant in calculating parity, charge value and polarity.

Referring to FIG. 1 there are shown timing diagrams for the word 0100 and 1010 (Lines A and C). The parity of the word 0100 is one because there is an odd number of transitions. The charge is +2 because there are three positive bit times (+3) and one negative bit times (−1) for a net accumulated charge ac of +2. Line B is the integral of the timing diagram of line A, which graphically illustrates the charge accumulation.

The parity of the word 1010 is zero, i.e., there are an even number of transitions, and the net accumulated charge ac is zero, as illustrated in line D.

Every code word can be designated as ±C,P or 0,P where C is the remanent charge and P is the parity designated as odd (1) or even (0). This designation is a fixed characteristic of each word which can be used to determine the usage of a word in a d.c. free code.

The net accumulated d.c. charge ac before encoding the ith word of a message is expressed as $$ac_{i-1} = \sum_{i=-1}^{-\infty} C_i (-1)^{P_i - 1} \quad (1)$$

Where p is the accumulated parity expressed as $$P_{i-1} = \sum_{i=-1}^{-\infty} \theta\, P_i \quad (2)$$

Where
$\Sigma\theta$ = modulo 2 sum, and
P = parity of each word

Balanced messages satisfy at least one of the following Categories 1 through 6:

1. Each of the individual encoded words of a message developed from source words is d.c. balanced (0,0 or 0,1), and C is constant.
2. All encoded words have an odd parity, are unbalanced and are of the same amplitude and polarity (+C,1 or −C,1), and C is constant.
3. All encoded words are either balanced with an even parity (0,0) or unbalanced with the same amplitude and polarity, and have an odd parity (i.e., +C,1 or −C,1 but not both), and C is constant.
4. All encoded words are either in category 3 (0,0 or ±C,1) or are paired as +C,0 and −C,0 for each source word that cannot be satisfied by a category 3 scheme due for example to insufficient encoding choices, and C is constant.
5. All encoded words are either in category 1 (0,0 or 0,1) or are paired as +C,P and −C,P for each source word that cannot be satisfied by a category 1 scheme, and C is constant.
6. In combination with any one of the five categories of d.c. free codes above, the code contains words of more than one value of remanent charge (C,C', etc.) in which words that contain a remanent charge different from the unpaired words are each paired with other words of opposite polarity, and C need not be constant.

The code categories enumerated above are in descending order of efficiency. An efficient d.c. balanced code is one whose temporary imbalances do not remain long and are not of high amplitude. Category 1 is considered most efficient since all imbalances are constrained to remain within one word. In Category 2 each pair of words balance each other. Therefore, the unbalanced charge C persists for less than the time required to convey only two words. In categories 3 through 6 a remanent charge from one word may last for the remainder of the message or until another unbalanced word appears to cancel the charge. Categories 1 through 3 describe most d.c. free codes in the prior art and are by the standards of the present invention trivial solutions to the encoding problem.

Two d.c. free codes in popular use are examples of categories 1 and 3. These are Frequency Modulation (FM) and Phase Modulation (PM). These codes encode one data bit into two code bits. In both cases, one of the code bits is always a "1" which provides the necessary clocking information. Depending on whether the clock bit is considered as the first or the second code bit, these codes will fit category 3 or category 1 respectively.

According to the invention, an encoding scheme is constructed which satisfies any of the categories 4, 5 or 6, and in particular includes in an encoding scheme combinations of encoded words, specifically word pairs, for each source word that cannot be satisfied by an encoding scheme satisfying all imposed constraints with a single encoding word. Thus encoding schemes are possible which do not require additional bits to provide a sufficient choice for mapping of the source code into the constrained code. A method is provided for deciding which of each pair of alternative encoding words is to be used to represent the source word. A general implementation of this method is as follows:

1. Provide an accumulated charge polarity indicator A and an accumulated parity indicator parity indicator B, each of which is initially set to zero at the beginning of each data message and which has only two values, namely, 1 and 0.
2. Calculate the net accumulated charge ac according to Equation (1) using Equation (2). (The value ac will be equal to some multiple of the charge constant C.)
3. Update the charge polarity indicator A after encoding each source word according to the following criteria:
   a. $A=1$ when $ac=+C$
   b. $A=0$ when $ac=-C$
   c. $A=0$ when $ac=0$ and the non-paired words in the available set include $+C,1$ type words, and the paired words in the set having the largest remanent charge are $+C',1$ or $-C',0$, where $C'$ is a multiple of C, the charge contributed by one encoded bit.
   d. $A=1$ when $ac=0$ and the non-paired words in the set include $-C,1$ words, and the paired words with the largest remanent charge include $-C',1$ or $+C',0$ type words. In the event the paired words of the potential encoding set with the largest remanent charges have equal remanent charge, then those paired words must meet either the criteria of c or d. If the conditions of c and d cannot be met, and when $ac=0$, set $A=1$ or $A=0$, depending upon which value of A would result in the lowest peak instantaneous accumulated charge.
4. Store the accumulated parity value p calculated according to Equation 2 as the accumulated parity indicator B.
5. Toggle the accumulated parity indicator B under either of the following conditions:
   a. After encoding each odd parity source word, or
   b. After every transition of the encoded serial data stream. (The accumulated parity indicator B may be toggled by modulo-2 addition of the computed parity of the encoded word under examination with the current value of the accumulated parity indicator B.)
6. Whenever a non-balancing word is to be encoded, compare the accumulated charge polarity indicator A with the accumulated parity indicator B to determine which of the paired code words to use. If $A=B$, use the $+C$ code word. If A is not equal to B use the $-C$ code word.

The above algorithm is repeated for each source word to be encoded.

In order to explain the principles of this algorithm, it is helpful to give specific examples. These examples are merely illustrative and do not limit the scope of the invention.

From a field of six-bit words having the characteristics necessary for an RLL code with $(d,k)=(0,3)$, and fixed length words, d.c. free codes with ether fixed or variable length words may be derived according to the principles of this algorithm. However, for the sake of simplicity, only codes with fixed length words have been used as examples.

The following boundary constraints may be assumed for generating a six-bit word field:
  a. No more than two zeroes at the beginning of each word; and
  b. no more than one zero at the end of each word.

Sixty four possible combinations comprise the field of six-bit words. Out of the sixty-four possible combinations, forty-one are words that have the desired $(d,k)$ constraints, as shown in Table 1. These forty-one words may be analyzed by assigning a classification code depicting remanent charge, polarity, amplitude, and bit parity. By properly selecting words, codes can readily be constructed which fall into categories one through three.

TABLE 1

| 1. | 0 0 1 0 0 1 | 0,0 | 21. | 1 0 0 1 0 1 | +2,1 |
|---|---|---|---|---|---|
| 2. | 0 0 1 0 1 0 | −2,0 | 22. | 1 0 0 1 1 0 | +4,1 |
| 3. | 0 0 1 0 1 1 | 0,1 | 23. | 1 0 0 1 1 1 | +2,0 |
| 4. | 0 0 1 1 0 1 | −2,1 | 24. | 1 0 1 0 0 1 | 0,1 |
| 5. | 0 0 1 1 1 0 | 0,1 | 25. | 1 0 1 0 1 0 | +2,1 |
| 6. | 0 0 1 1 1 1 | −2,0 | 26. | 1 0 1 0 1 1 | 0,0 |
| 7. | 0 1 0 0 0 1 | +2,0 | 27. | 1 0 1 1 0 1 | +2,0 |
| 8. | 0 1 0 0 1 0 | 0,0 | 28. | 1 0 1 1 1 0 | 0,0 |
| 9. | 0 1 0 0 1 1 | +2,1 | 29. | 1 0 1 1 1 1 | +2,1 |
| 10. | 0 1 0 1 0 1 | 0,1 | 30. | 1 1 0 0 0 1 | −2,1 |
| 11. | 0 1 0 1 1 0 | +2,1 | 31. | 1 1 0 0 1 0 | 0,1 |
| 12. | 0 1 0 1 1 1 | 0,0 | 32. | 1 1 0 0 1 1 | −2,0 |
| 13. | 0 2 2 0 0 1 | −2,1 | 33. | 1 1 0 1 0 1 | 0,0 |
| 14. | 0 1 1 0 1 0 | 0,1 | 34. | 1 1 0 1 1 0 | −2,0 |
| 15. | 0 1 1 0 1 1 | −2,0 | 35. | 1 1 0 1 1 1 | 0,1 |
| 16. | 0 1 1 1 0 1 | 0,0 | 36. | 1 1 1 0 0 1 | +2,0 |
| 17. | 0 1 1 1 1 0 | −2,0 | 37. | 1 1 1 0 1 0 | 0,0 |
| 18. | 0 1 1 1 1 1 | 0,1 | 38. | 1 1 1 0 1 1 | +2,1 |
| 19. | 1 0 0 0 1 0 | +2,0 | 39. | 1 1 1 1 0 1 | 0,1 |
| 20. | 1 0 0 0 1 1 | +4,1 | 40. | 1 1 1 1 1 0 | +2,1 |
|  |  |  | 41. | 1 1 1 1 1 1 | 0,0 |

In attempting to form a code with a particular set of constraints, however, it may be found that an inadequate number of words are available to fulfill the requirements of any of the categories 1 through 3. Therefore, according to the invention, a code is formed using word pairs the choice of which are controlled to prevent any net d.c. charge to continue to accumulate in amplitude without cancellation. As one example of a code according to the invention, consider the sixteen level code set forth in Table 2, which maps a four-bit source word code into a six-bit balanced output code with $(d,k)=(0,2)$. There are adequate words in Table 1 with $(d,k)=(0,3)$ to satisfy code categories 1, 2 or 3 but not enough to satisfy those categories with (d,k)=(0,2). Table 2 satisfies a category 4 code.

TABLE 2

| | OUTPUT CODE | | | | | | SOURCE WORD | | | |
|---|---|---|---|---|---|---|---|---|---|---|
| | C5 | C4 | C3 | C2 | C1 | C0 | | D3 | D2 | D1 | D0 |
| 0,0 | 0 | 1 | 0 | 0 | 1 | 0 | | 0 | 0 | 0 | 0 |
| +2,1 | 0 | 1 | 0 | 0 | 1 | 1 | | 0 | 0 | 0 | 1 |
| 0,0 | 0 | 1 | 0 | 1 | 1 | 0 | | 0 | 0 | 1 | 0 |
| +2,1 | 0 | 1 | 0 | 1 | 1 | 1 | | 0 | 0 | 1 | 1 |
| +2,1 | 1 | 0 | 1 | 0 | 1 | 0 | | 0 | 1 | 0 | 0 |
| 0,0 | 1 | 0 | 1 | 0 | 1 | 1 | | 0 | 1 | 0 | 1 |
| 0,0 | 1 | 0 | 1 | 1 | 1 | 0 | | 0 | 1 | 1 | 0 |
| +2,1 | 1 | 0 | 1 | 1 | 1 | 1 | | 0 | 1 | 1 | 1 |
| +2,1 | 1 | 0 | 0 | 1 | 0 | 1 | | 1 | 0 | 0 | 0 |
| +2,0 | 1 | 0 | 0 | 1 | 1 | 1 | −2,0 1 1 0 0 1 1 | 1 | 0 | 0 | 1 |
| 0,0 | 0 | 1 | 1 | 1 | 0 | 1 | | 1 | 0 | 1 | 0 |
| 0,0 | 1 | 1 | 0 | 1 | 0 | 1 | | 1 | 0 | 1 | 1 |
| 0,0 | 1 | 1 | 0 | 1 | 0 | 0 | | 1 | 1 | 0 | 0 |
| +2,1 | 1 | 1 | 1 | 0 | 1 | 1 | | 1 | 1 | 0 | 1 |
| +2,1 | 1 | 1 | 1 | 1 | 1 | 0 | | 1 | 1 | 1 | 0 |
| 0,0 | 1 | 1 | 1 | 1 | 1 | 1 | | 1 | 1 | 1 | 1 |
| | Alternate Choices for the ±2,0 Word | | | | | | | | | | |
| +2,0 | 1 | 0 | 1 | 1 | 0 | 1 | −2,0 0 1 1 0 1 1 | | | | |
| +2,0 | 1 | 1 | 1 | 0 | 0 | 1 | −2,0 0 1 1 1 1 0 | | | | |
| | | | | | | | −2,0 1 1 0 1 1 0 | | | | |

Constraints
(d, k; m, n; r, c) = (0, 2; 4, 6; 1, ± 3)

All words of the code in Table 2 fall into category 3 as either 0,0 or +2,1 type words with the exception of one word. For this word a +C,0 word and a −C,0 word have been chosen as a pair from among the other word pairs available from Table 1. A selection algorithm is used according to the invention to decide which of the words of the word pair to choose when encoding the particular code word from the source code words. The code assignment selected has been optimized for minimum logic cost and error propagation. The majority of single bit errors will be restricted to one or two decoded bit errors. In the worse case, propagation of error can at most persist for an entire word of four bits.

Table 3 is a State Sequence Chart constructed according to an algorithm according to the invention. This State Sequence Chart can be incorporated into a decision process and implemented with random logic or table lookup techniques

TABLE 3

State Sequence Chart

| | | Choose from | Next State After | | |
|---|---|---|---|---|---|
| State | ac,p | ±2,0 | ±2,0 | ±2,1 | 0,0 |
| 1 | 0,0 | −2,0 | 2 | 4 | 1 |
| 2 | −2,0 | +2,0 | 1 | 3 | 2 |
| 3 | 0,1 | −2,0 | 4 | 2 | 3 |
| 4 | +2,1 | +2,0 | 3 | 1 | 4 | where
ac = accumulated charge
p = accumulated charge

A few comments are in order about the State Sequence Chart of Table 3. First, the four states in the State Sequence Chart are self contained since no state can lead to any other state that is not included as one of the four states. Therefore, it is not necessary to consider other states that might lead to a higher absolute value of accumulated charge. Second, since the choice of the type C,0 word is based only on the presence or absence of a unit of charge regardless of polarity, only one storage register is necessary for the encoding scheme. This function can be implemented in the form of a flip-flop which is toggled whenever a word is encoded that contains a net remanent charge. Finally, certain states which result in a charge parity characteristic of −2,1 or +2,0 must be avoided since these states would result in a condition in which the charge constraint is exceeded if followed by a +2,0 type word. This condition will not occur if the method of encoding according to the invention is followed.

The following is an algorithm for encoding source words of four-bit groups into encoded data of six-bit groups:

1. Block all incoming data into groups of four-bits, each bit designated either D3, D2, D1, D0, wherein D3 is the highest order bit.
2. Encode the four-bit source words into six-bit encoded words designated C5, C4, C3, C2, C1, C0, wherein C5 is the highest order bit and the first in a serial sequence, the encoding being effected according to the following Boolean equations:

$$C0 = D0 + D3 * \overline{D2}$$

$$C1 = \overline{D3} + D2 + \overline{D1} * D0$$

$$C2 = D1 + D3 * \overline{D2} * \overline{D0} + D3 * \overline{D2} * D0 * A$$

$$C3 = D2 + D3 * D1 * \overline{D0}$$

$$C4 = \overline{D3} * \overline{D2} + D3 * D2 + D3 * D1 + \overline{D2} * \overline{D1} * D0 * \overline{A}$$

$$C5 = D3 * \overline{D1} + D3 * D0 + D2$$

$$A_i = A_{i-1} \oplus (\overline{D2} * \overline{D1} * D0 + \overline{D3} * D1 * D0 + E * \overline{D1} * \overline{D0} + D3 * D2 * F)$$

where A = Modulo 2 count of all previously encoded words with non-zero charge (+2,1, +2,0, or −2,0), E is true if D3 is not equal to D2, F is true if D1 is not equal to D0, and $\oplus$ is the modulo 2 sum.

3. Place the encoded data into a six-bit shift register for providing serial data to an output.

In the above expressions, the parameter A is a computed parameter requiring information regarding the previous non-zero charge type encoded words plus the values for all bits of the current source word. The parameter A is contingent on other logic values, for convenience designated E and F.

A decoding sequence according to the invention involves the extraction of the original source words consisting of bits D3 through D0 from the encoded words consisting of bits C5 through C0. Before decoding can take place, the encoded data C5 through C0 must be synchronized by blocking the serial data stream into words. For this purpose, a preamble sequence is normally included in the data stream for initial synchronization of the serial data information. The preamble may comprise a sequence of an all one pattern followed by a word synchronizing pattern terminating in a zero. The zero in the pattern may start a modulo six counter to determine word boundaries.

Decoding the encoded sequence C5 through C0 can then be carried out according to the following decoding equations:

$$D0 = C0 * C1 + C4 * \overline{C3} * \overline{C1}$$

$$D1 = C4 * C2 + C3 * C2$$
$$D2 = C5 * C3$$

$$D3 = C5 * C4 + C4 * C3 + \overline{C4} * \overline{C3}$$

Alternatively, a table may be constructed from which the original source words can be derived from the encoded sequence.

A code constrained to be d.c. free can also be constructed without the assumption that alternate odd parity words with equal charge cancel the d.c. component of the other. Such a code has type 0,0 and type 0,1 words in addition to words with ±C type words. In such a code, two successive type +C,1 words separated by a type 0,1 word will cause the word charges to add rather than to substract. It is therefore necessary to construct a constrained code which has pairs for all non-balanced words, and an algorithm must be provided for selecting among one or the other of each pair of words so as to produce a d.c. free output. In the following example shown in Table 4, a three-bit source word code is mapped into a four-bit constrained code wherein the encoding scheme provides that +2,0 type words and +2,1 type words are paired with −2,0 type words.

TABLE 4

| | OUTPUT CODE | | | | | SOURCE CODES | | |
|---|---|---|---|---|---|---|---|---|
| | C3 | C2 | C1 | C0 | | D2 | D1 | D0 |
| 0,0 | 1 | 0 | 1 | 0 | | 0 | 0 | 0 |
| +2,1 | 1 | 0 | 1 | 1 | −2,0 0 0 1 1 | 0 | 0 | 1 |
| 0,0 | 0 | 1 | 0 | 1 | | 0 | 1 | 0 |
| 0,1 | 0 | 1 | 1 | 1 | | 0 | 1 | 1 |
| +2,0 | 1 | 0 | 0 | 1 | −2,0 1 1 0 0 | 1 | 0 | 0 |
| 0,1 | 1 | 1 | 0 | 1 | | 1 | 0 | 1 |
| +2,1 | 1 | 1 | 1 | 0 | −2,0 0 1 1 0 | 1 | 1 | 0 |
| 0,0 | 1 | 1 | 1 | 1 | | 1 | 1 | 1 |

State Sequence Chart

| | | | Choose From | Next State After: | | | |
|---|---|---|---|---|---|---|---|
| State | ac,p | A,B | ±C,P | +C,1 | ±C,0 | 0,1 | 0,0 |
| 1 | 0,0 | 0,0 | +C,P | 4 | 3 | 2 | 1 |
| 2 | 0,1 | 0,1 | −C,P | — | 4 | 1 | 2 |
| 3 | +2,0 | 1,0 | −C,P | — | 1 | 4 | 3 |
| 4 | +2,1 | 1,1 | +C,P | 1 | 2 | 3 | 4 |

Where:
A = 1 if ac is positive, otherwise A = 0
B = p

The following Boolean equations are used in the design of an encoder assuming the above code assignments. This is a Category 5 code according to the previous criteria:

$$C0 = D0 + \overline{D2} * D1 + D2 * \overline{D1} * G$$

$$C1 = D2 * D1 + \overline{D2} * \overline{D1} + D1 * D0$$

$$C2 = D1 + D2 * D0 + D2 * \overline{D0} * \overline{G}$$

$$C3 = \overline{D2} * \overline{D1} * (\overline{D0} + G) + D2 * (\overline{D1} + D0 + G)$$

$$A_i = A_{i-1} \oplus (D2 * \overline{D0} + \overline{D2} * \overline{D1} * D0)$$

where

G is true if A=B and
⊕ is the modulo 2 sum.

The following Boolean equations can be used in the design of the decoder, assuming the above code assignments:

$$D0 = C0 * C1 + C0 * C2 * C3$$

$$D1 = C2 * C1 + \overline{C3} * C2$$

$$D2 = C3 * \overline{C1} + C3 * C2 + \overline{C3} * \overline{C0}$$

A table lookup scheme can likewise be constructed for implementing the mapping as shown above.

The following Boolean expressions are employed to construct a category 6 code according to the invention. This code is noteworthy because it illustrates the flexibility and economy achievable by use of a code design technique according to the invention. In this simple example, two bits of source data are converted into three bits of code data. The fact that one of the words contains a remenant charge of +3 puts this coding scheme into category 6.

The encoding equations are:

$$C0 = D0$$

$$C1 = D1 + \overline{D1} * \overline{D0} * \overline{E}$$

$$C2 = \overline{D1} * \overline{D0} + D1 * D0 + \overline{D1} * D0 * E$$

Where
E is true if A is equal to B, and
A is true if the accumulated charge for all previously encoded words, ac, is positive, and
ac is the algebraic sum of the charges of all previously encoded words, and
B is the accumulated parity of all previously encoded words.

The decoding equations are $$D0 = C0$$

$$D1 = \overline{C2} * C1 + C1 * C0$$

The mapping by this category 6 code of the source data into a primary output code with alternates for output code words is illustrated in Table 5.

TABLE 5

| (d,k;m,n;r,c) = (0,3;2,3;1,+ −4) | | | | | | | | |
|---|---|---|---|---|---|---|---|---|
| | PRIMARY CODE | | | | ALTERNATE CODE | | SOURCE DATA | |
| | C2 | C1 | C0 | | C2 | C1 | C0 | D1 | D0 |
| +3,1 | 1 | 0 | 0 | −1,0 | 1 | 1 | 0 | 0 | 0 |
| +1,0 | 1 | 0 | 1 | −1,1 | 0 | 0 | 1 | 0 | 1 |
| +1,1 | 0 | 1 | 0 | | | | | 1 | 0 |
| +1,1 | 1 | 1 | 1 | | | | | 1 | 1 |
| | | | | SPARE ALTERNATE | | | | |
| | | | | −1,0 | 0 | 1 | 1 | | |

Turning now to FIG. 2, there is shown a generalized encode/decode system 10 comprising an encoder 12, a transmission/recording medium 14 and a decoder 16. The transmission/recording medium 14 is typically a medium through which signals may be a.c. coupled or otherwise stored and retrieved, such as a transmission line or a magnetic disk. The encoder 12 includes an encoding processor 18, and the decoder 16 includes a decoding processor 20, each of which implements the respective encoding and decoding equations for the preselected and designed category of encoding scheme.

In the encoder 12, source information is provided to a source serial register 22, the output of which is coupled to the encoding processor 18 and to a sequence controller 24. The sequence controller 24 receives a clock signal from a master clock 26 and produces a data clock pulse output to the shift register 22 and a shift-/load clock output to an encoded data shift register 28. The data clock signal may be related to the shift clock signal by the ratio of the number of bits per word between the input and the output of the encoder 12. The output need only operate at a sufficiently greater rate than the input to accommodate any necessary additional bits. The encoding processor 18 generates the encoded values and loads the encoded values into the encoded data shift register 28 which can then be serially shifted to an output port 30 coupled to the medium 14. Typically the output port 30 provides code in the NRZI format.

Signals received through the medium 14 are loaded through a sequence controller 32 of the decoder 16, the sequence controller 32 being operative to provide the necessary word boundaries in the incoming encoded data. The incoming encoded data is loaded serially into an encoded data shift register 34, the output of which is coupled to the decoding processor 20 and to the sequence controller 32. The decoding processor 20 operates upon the encoded data constrained according to the design parameters and is responsive to control signals from the sequence controller 32 to recover information representative of the source data. The data so decoded is loaded into a decoded data shift register 36 for output to an output signal utilization device (not shown) through a decoder output port 38.

Referring now to FIG. 3, there is shown one implementation of an encoder 10 according to the invention, and in particular, an encoding processor 18 implementing a Category 5 code which is operative to convert three-bit source data words into four-bit encoded constrained data words. The encoder 10 includes a shift register 22 consisting of three flip-flops 40, 42 and 44 through which the incoming source data is shifted. The encoded data in shift register 28 consists of four flip-flops 46, 48, 50 and 52 into which the encoded data is shifted in parallel and out of which the encoded data is serially shifted at an output terminal. The encoding processor 18 comprises AND gates and OR gates arranged in the order implementing the foregoing Boolean equations set forth above for Category 5 encoding scheme. Circuit means 29, which may be considered a separate element because of its look-back function, includes storage elements 31, 33, 35 as well as specific AND gates and OR gates for keeping track of values based on the accumulated charge of previous input data and generally also the parity of the data. Values representative of A and B are fed back into the other gates of the encoding processor 18. The write clock, load clock and shift clock signals are provided by the sequence controller 24 (FIG. 2) and basic clock (not fully shown).

Turning to FIG. 4, there is shown a decoder 16 according to the invention for decoding data encoded by the encoder 10 of FIG. 3. A four-bit shift register 32 comprises four flip-flops 54, 56, 58 and 60. A three-bit decoded data shift register 36 consists of three flip-flops 62, 64 and 66. The read clock is derived from the encoded data by processing through the sequence controller 32 (FIG. 2) which provides to the decoding processor 20 the word boundaries necessary for identifying the bit positions of the incoming encoded data. A data clock output 68 is provided for synchronizing the decoded data. The decoding processor 20 consists of the AND gates and OR gates necessary to decode the three decoded data bits. The gates implement the decoding Boolean equations set forth hereinabove for the Category 5 process.

FIG. 5 illustrates timing for the circuitry of FIGS. 3 and 4. FIG. 5 shows the read/write clock signal, the shift clock, the load clock, the source data signal for approximately four words and the encoded data signal. The encoded data signal is shown against a set of word boundaries setting forth the charge and parity of each of the encoded words. The NRZI code as applied to the medium 14 is shown. An integration of the NRZI code will demonstrate that any sequence will exhibit a zero d.c. bias.

The invention has now been explained with reference to specific embodiments. Other embodiments will be apparent to those skilled in the art upon reference to this description. It is therefore not intended that this invention be limited, except as indicated by the appended claims.

I claim:

1. An apparatus for encoding sequentially a plurality of input binary data digital signals of a source code into output binary data digital signals forming words according to encoding rules of a run-length-limited encoding set requiring d.c.-balanced message content, said apparatus comprising:

first data storage means for temporarily storing said input digital signals;

second data storage means for storing a digital charge value related to charge of at least one encoded word prior to a current encoded word; and encoding logic means coupled to said first data storage means and to said second data storage means for encoding said input signals into said output signals within said run-length limited constraints wherein said encoding set has fewer code choices than is required in a closed set consisting of single code words having one-to-one conversion between said source code and said encoding set, and wherein said digital charge value is employed to modify said encoding rules for said current encoded word.

2. An apparatus for encoding sequentially a plurality of input binary data digital signals of a source code into output binary data digital signals forming words according to encoding rules of a run-length-limited encoding set requiring d.c.-balanced message content, said apparatus comprising:

first data storage means for temporarily storing said input digital signals;

second data storage means for storing a digital parity value related to parity of at least one encoded word prior to a current encoded word; and encoding logic means coupled to said first data storage means and to said second data storage means for encoding said input signals into said output signals within said run-length limited constraints wherein said encoding has fewer code choices than is required in a closed set consisting of single code words having one-to-one conversion between said source code and said encoding set, and wherein said digital parity value is employed to modify said encoding rules for said current encoded word.

3. The apparatus according to claim 1 or 2 wherein both digital parity value and digital charge value of at least one prior encoded word are employed in combination to modify said encoding rules for said current encoded word.

4. The apparatus according to claim 3 wherein said digital charge value consists of a charge polarity component and a charge amplitude component, said charge polarity component being constrained to three states representing positive, negative and zero charge values, said positive value state of said polarity component being represented by a first value of a first binary digit, said negative value state of said polarity component being represented by a second value of said first binary digit, said zero value state being represented by either said first value or said second value of said first binary digit, said apparatus including means responsive to comparison between said charge polarity component and said digital parity value for selecting either a first digital word of said encoding set if said charge polarity component and said digital parity value are equal or a second digital word of said encoding set if said charge polarity component and said digital parity are not equal.

5. The apparatus according to claim 4 further including means for accumulating a modulo 2 sum of parity of each previously encoded word of said encoding set and wherein said digital parity value is said modulo 2 sum of previously encoded digital words of said encoding set.

6. The apparatus according to claim 4 wherein said selecting means is operative to select an encoded word having a positive remanent charge if said charge polarity component and said digital parity value are equal and to select and encoded word having a negative remanent charge if said charge polarity component and said digital parity value are not equal.

7. The apparatus according to claim 1 wherein said encoding logic means and said second data storage means includes means for generating said output binary data as a six-bit word-length constrained encoding set from a four-bit source code, said source code having at least one four-bit code encodable into a choice of two six-bit code words.

8. The apparatus according to claim 7 wherein said encoding logic means is operative to encode said four-bit source code into said six-bit word length constrained encoding set according to the following expression:

$$C0 = D0 + D3 * \overline{D2}$$

$$C1 = \overline{D3} + D2 + \overline{D1} * D0$$

$$C2 = D1 + D3 * \overline{D2} * \overline{D0} + D3 * \overline{D2} * D0 * A$$

$$C3 = D2 + D3 * D1 * \overline{D0}$$

$$C4 = \overline{D3} * \overline{D2} + D3 * D2 + D3 * D1 + \overline{D2} * \overline{D1} * D0 * \overline{A}$$

$$C5 = D3 * \overline{D1} + D3 * D0 + D2$$

-continued $$A_i = A_{i-1} \oplus (\overline{D2} * \overline{D1} * D0 + \overline{D3} * D1 * D0 + E * \overline{D1} * \overline{D0} + D3 * D2 * F)$$

where
A is the modulo 2 count of all previously encoded words with non-zero charge (+2,1 +2,0 or −2,0),
E is true if D3 is not equal to D2,
F is true if D1 is not equal to D0,
D0 through D3 are input binary data, and
C0 through C5 are output binary data.

9. The apparatus according to clam 1 wherein said encoding logic means and said second data storage means includes means for generating said output binary data as a four-bit word-length constrained encoding set from a three-bit source code, said source code having at least one three-bit code encodable into a choice of at least two four-bit code words.

10. The apparatus according to claim 9 wherein said encoding logic means is operative to encode said three-bit source code into said four-bit word-length constrained encoding set according to the following expression:

$$C0 = D0 + \overline{D2} * D1 + D2 * \overline{D1} * G$$

$$C1 = D2 * D1 + \overline{D2} * \overline{D1} + D1 * D0$$

$$C2 = D1 + D2 * D0 + D2 * \overline{D0} * \overline{G}$$

$$C3 = \overline{D2} * \overline{D1} * (\overline{D0} + G) + D2 * (\overline{D1} + D0 + G)$$

$$A_i = A_{i-1} \oplus (D2 * \overline{D0} + \overline{D2} * \overline{D1} * D0)$$

where
G is true if A=B, and
D0 through D2 are input binary data, and
C0 through C3 are output binary data.

11. An apparatus for decoding sequentially a plurality of input binary data digital signals forming input words according to encoding rules have a run-length-limited encoding set requiring D.C.-balanced message content into output binary data digital words to recover a digital message in a source code, said apparatus comprising:
decoding logic means coupled to said receive said input signals and means operative to provide said output signals, said logic means for mapping said input binary data digital signals into said output binary data digital signals; and wherein at least three input words of said input binary data digital signals are mapped into at least one output word of said output binary data digital signals without reference to previous input words or to future input words.

12. The apparatus according to claim 11 wherein said decoding logic means includes means for generating said output binary data as a four-bit word set from input binary data as a six-bit word set according to the following expression:

$$D0 = C0 * C1 + C4 * \overline{C3} * \overline{C1}$$

$$D1 = C4 * C2 + C3 * C2$$
$$D2 = C5 * C3$$

-continued $$D3 = C5 * C4 + C4 * C3 + \overline{C4} * \overline{C3}$$

where
D0 through D3 are binary data, and
C0 through C5 are input binary data.

13. The apparatus according to claim 11 wherein said decoding logic means includes means for generating said output binary data as a three-bit word set from input binary data as a four-bit word set according to the following expression:

$$D0 = C0 * C1 + C0 * C2 * C3$$

$$D1 = C2 * C1 + \overline{C3} * C2$$

$$D2 = C3 * \overline{C1} + C3 * C2 + \overline{C3} * \overline{C0}$$

where
D0 through D2 are output binary data, and
C0 through C3 are input binary data.

14. A method for encoding sequentially a plurality of input binary data digital signals of a source code into output binary data digital signals forming words according to encoding rules of a run-length-limited encoding set requiring d.c.-balanced message content, said method comprising the steps of:
temporarily storing said input digital signals;
temporarily storing a digital charge value related to charge of at least one encoded word which has been encoded prior to a current encoded word;
encoding said input signals into said output signals within said run-length limited constraints according to an encoding set having fewer code choices than is required in a closed set consisting of single code words having one-to-one conversion between said source code and said encoding set; and
employing said first digital charge value to modify said encoding rules for said current encoded word.

15. A method for encoding sequentially a plurality of input binary data digital signals of a source code into output binary data digital signals forming words according to encoding rules of a run-length-limited encoding set requiring d.c.-balanced message content, said method comprising the steps of:
temporarily storing said input digital signals;
temporarily storing a digital parity value related to parity of at least one encoded word which has been encoded prior to a current encoded word;
encoding said input signals into said output signals within said run-length-limited constraints according to an encoding set having fewer code choices than is required in a closed set consisting of single code words having one-to-one conversion between said source code and said encoding set; and
employing said digital parity value to modify said encoding rules for said current encoded word.

16. The method according to claim 14 or 15 wherein said employing step comprises:
employing both digital parity value and digital charge value of at least one prior encoded word in combination to modify said encoding rules for said current encoded word.

17. The method according to claim 16 wherein said digital charge value consists of a charge polarity component and a charge amplitude component, said charge polarity component being constrained to three states representing positive, negative and zero charge values, said positive value state of said polarity component being represented by a first value of a first binary digit, said negative value state of said polarity component being represented by a second value of a first binary digit, said zero value state being represented by either said first value or said second value of said first binary digit, wherein said employing step comprises comparing said charge polarity component and said digital parity value and selecting either a first digital word of said encoding set if said charge polarity component and said digital parity value are equal or a second digital word of said encoding set if said charge polarity component and said digital parity value are not equal.

18. The method according to claim 17 further including accumulating a modulo 2 sum of parity of each previously encoded word of said encoding set to obtain said digital parity value for said employing step.

19. The method according to claim 17 wherein said selecting step comprises choosing an encoded word having a positive remanent charge if said charge polarity component and said digital parity value are equal and choosing an encoded word having a negative remanent charge if said polarity component and said digital parity value are not equal.

20. The method of claim 14 for generating said output binary data as a six-bit word length constrained encoding set from a four-bit source code wherein said encoding step comprises the steps of implementing the following Boolean equations:

$$C0 = D0 + D3 * \overline{D2}$$

$$C1 = \overline{D3} + D2 + \overline{D1} * D0$$

$$C2 = D1 + D3 * \overline{D2} * \overline{D0} + D3 * \overline{D2} * D0 * A$$

$$C3 = D2 + D3 * D1 * \overline{D0}$$

$$C4 = \overline{D3} * \overline{D2} + D3 * D2 + \underline{D3} * D1 + \overline{D2} * \overline{D1} * D0 * \overline{A}$$

$$C5 = D3 * \overline{D1} + D3 * D0 + D2$$

$$A_i = A_{i-1} \oplus (\overline{D2} * \overline{D1} * D0 + \overline{D3} * D1 * D0 + E * \overline{D1} * \overline{D0} + D3 * D2 * F)$$

where
A = Modulo 2 count of all previously encoded words with non-zero charge (+2,1 +2,0, or −2,0),
E is true if D3 is not equal to D2,
F is true if D1 is not equal to D0,
D0 through D3 are input binary data, and
C0 through C5 are output binary data.

21. The method according to claim 14 for generating said output binary data as a four-bit word length constrained encoding set from a three-bit source code wherein said encoding step comprises the steps of implementing the equations:

$$C0 = D0 + \overline{D2} * D1 + D2 * \overline{D1} * G$$

$$C1 = D2 * D1 + \overline{D2} * \overline{D1} + D1 * D0$$

-continued $$C2 = D1 + D2 * D0 + D2 * \overline{D0} * G$$

$$C3 = \overline{D2} * \overline{D1} * (\overline{D0} + G) + D2 * (\overline{D1} + D0 + G)$$

-continued $$A_i = A_{i-1} \oplus (D2 * \overline{D0} + \overline{D2} * \overline{D1} * D0)$$

where
G is true if A=B,
D0 through D2 are input binary data, and
C0 through C3 are output binary data.

* * * * *